United States Patent
Chen et al.

(10) Patent No.: US 8,541,882 B2
(45) Date of Patent: Sep. 24, 2013

(54) STACKED IC DEVICE WITH RECESSED CONDUCTIVE LAYERS ADJACENT TO INTERLEVEL CONDUCTORS

(75) Inventors: Shih-Hung Chen, Jhudong Township, Hsinchu County (TW); Yan-Ru Chen, Hsinchu (TW); Lo-Yueh Lin, Yilan County (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 13/240,058

(22) Filed: Sep. 22, 2011

(65) Prior Publication Data
US 2013/0075920 A1 Mar. 28, 2013

(51) Int. Cl.
*H01L 23/48* (2006.01)
*H01L 21/283* (2006.01)

(52) U.S. Cl.
USPC ............ 257/774; 257/E23.011; 257/E21.159; 257/763; 257/752; 257/750; 257/764; 257/321; 257/324

(58) Field of Classification Search
USPC .................. 257/774, 752, 750, 763, 764, 324, 257/E29.309, E23.011, E21.159, 321, E29, 257/309; 438/622
See application file for complete search history.

(56) References Cited

U.S. PATENT DOCUMENTS

| | | | |
|---|---|---|---|
| 6,034,882 A | 3/2000 | Johnson et al. | |
| 6,518,670 B1 * | 2/2003 | Mandelman et al. | ......... 257/752 |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,301,818 B2 | 11/2007 | Lu et al. | |
| 7,382,647 B1 | 6/2008 | Gopalakrishnan | |
| 7,851,849 B2 | 12/2010 | Kiyotoshi | |
| 8,187,936 B2 * | 5/2012 | Alsmeier et al. | .............. 438/264 |
| 8,330,208 B2 * | 12/2012 | Alsmeier et al. | .............. 257/321 |
| 2005/0280061 A1 | 12/2005 | Lee | |
| 2008/0073635 A1 | 3/2008 | Kiyotoshi et al. | |
| 2008/0101109 A1 | 5/2008 | Haring-Bolivar et al. | |
| 2009/0097321 A1 | 4/2009 | Kim et al. | |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

(Continued)

*Primary Examiner* — A O Williams
(74) *Attorney, Agent, or Firm* — James F. Hann; Haynes Beffel & Wolfeld LLP

(57) ABSTRACT

An IC device comprises a stack of contact levels, each including conductive layer and an insulation layer. A dielectric liner surrounds an interlevel conductor within an opening in the stack of contact levels. The opening passes through a portion of the stack of contact levels. The interlevel conductor is electrically insulated from the conductive layers of each of the contact levels through the dielectric liner. A portion of the conductive layer at the opening is recessed relative to adjacent insulation layers. The dielectric liner may have portions extending between adjacent insulation layers.

15 Claims, 20 Drawing Sheets

(56) References Cited

U.S. PATENT DOCUMENTS

| | | |
|---|---|---|
| 2009/0184360 A1 | 7/2009 | Jin et al. |
| 2010/0270593 A1 | 10/2010 | Lung et al. |
| 2011/0084397 A1 | 4/2011 | Lung |

OTHER PUBLICATIONS

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages.

Jang et al., "Vertical Cell Array using TCAT(Terabit Cell Array Transistor) Technology for Ultra High Density NAND Flash Memory", 2009 Symposium on VLSI Technology Digest of Technical Papers, p. 192-193.

Johnson et al., "512-Mb PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

Kim et al., "Multi-Layered Vertical Gate NAND Flash Overcoming Stacking Limit for Terabit Density Storage", 2009 Symposium on VLSI Technology Digest of Technical Papers, p. 188-189.

Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages.

Lai, et al., "A Multi-Layer Stackable Thin-Film Transistor (TFT) NAND-Type Flash Memory", IEEE Int'l Electron Devices Meeting, Dec. 11-13, 2006.

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Paul et al., "Impact of a Process Variation on Nanowire and Nanotube Device Performance", IEEE Transactions on Electron Devices, vol. 54, No. 9, Sep. 2007, p. 2369-2376.

Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15.

* cited by examiner

STACKED IC DEVICE WITH RECESSED CONDUCTIVE LAYERS ADJACENT TO INTERLEVEL CONDUCTORS

CROSS-REFERENCE TO RELATED APPLICATIONS

This application is related to U.S. patent application Ser. No. 13/114,931; filed 24 May 2011.

BACKGROUND OF THE INVENTION

1. Field of the Invention

The present invention relates generally to high density integrated circuit devices, and more particularly to interconnect structures for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

As the size of different components all multi-levels three-dimensional stacked devices is decreased, problems relating to breakdown voltage and current leakage arise due to the reduced thickness of various insulating layers. For example, the thickness of the electrical insulation surrounding plugs or other electrical conductors passing through different contact levels of an interconnect region can be increased in response to these concerns. However, doing so increases the resistance of the plugs by reducing their cross-sectional areas. Alternatively, the cross-sectional areas of the plugs can be maintained; this however tends to increase the spacing between the plugs and thereby reducing the device density. There is a similar concern creating to ground or other interlevel plugs which electrically contact some or all of the contact layers within the interconnect region. By minimizing the cross-sectional area of the interlevel plug, efficient spacing is achieved but at the expense of limiting the contact area between the interlevel plugs and the conductive layers of the various contact levels. Increasing the cross-sectional area of the interlevel plugs results in reduced the device density.

SUMMARY OF THE INVENTION

An example of an IC device comprises a stack of contact levels. Each contact level comprises a conductive layer and an insulation layer. A dielectric liner surrounds an interlevel conductor within an opening in the stack of contact levels. The opening passes through a portion of the stack of contact levels. The interlevel conductor is electrically insulated from the conductive layers of each of the contact levels through the dielectric liner. A portion of the conductive layer at the opening is recessed relative to adjacent insulation layers. Some examples comprise an electrically insulating layer over the stack of contact levels and an interlevel conductor extension passing through the electrically insulating layer and making electrical contact with the interlevel conductor. In some examples, the dielectric liner comprises portions extending between adjacent insulation layers. In some examples, the portion of the dielectric liner is generally annular.

An example of three-dimensional stacked IC device comprises a stack of at least first, second, third and fourth contact levels. Each contact level comprises a conductive layer and an insulation layer. First, second, third and fourth electrical conductors are within contact openings passing through portions of the stack of contact levels. The first, second, third and fourth electrical conductors extend to and are in electrical contact with the first, second, third and fourth conductive layers, respectively. A dielectric liner circumferentially surrounds the second, third and fourth electrical conductors so that the second electrical conductor is electrically isolated from the first conductive layer, the third electrical conductor is electrically isolated from the second and third conductive layers, and the fourth electrical conductor is electrically isolated from the first, second and third conductive layers. Portions of the conductive layers at the conductive openings are recessed relative to the adjacent insulation layers. Portions of the dielectric liners extend between said adjacent insulation layers to create dielectric liner portions electrically isolating, and providing enhanced electrical insulation between, opposed conductive layers and electrical conductors.

A method creates electrical conductors for an IC device, the IC device comprising a stack of contact levels, each contact level comprising a conductive layer and an insulation layer. A contact opening is formed passing through a portion of the stack of contact levels thereby creating an exposed conductive layer edge and insulation layer edges. A recessed region is created in the conductive layer at the exposed conductive layer edge to create a recessed conductive layer edge. A dielectric liner is formed within the contact opening. Doing so covers the insulation layer edges and the recessed conductor layer edge with electrically insulating material deposited within the recessed region, and creates a lined contact opening. An electrical conductor is created within the lined contact opening using an electrically conductive material. The electrically insulating material within the recessed region electrically isolates the electrical conductor from the recessed conductor layer edge; this provides enhanced electrical insulation between the electrical conductor and the surrounding conductive layer. The electrical conductor is electrically connected to an underlying conductive layer. In some examples, the dielectric liner forming step comprises at least substantially filling the recessed region with the electrically insulating material. Some examples further comprise oxidizing the recessed conductive layer edge before the dielectric liner forming step.

A method creates electrical conductors for a three-dimensional stacked IC device, the IC device comprising a stack of at least first, second, third and fourth contact levels, each contact level comprising a conductive layer and an insulation layer. Contact openings are formed to through portions of the stack of contact levels thereby creating exposed conductive layer edges and insulation layer edges. Recessed regions are created in the conductive layers at the exposed conductive layer edges between adjacent insulation layers at the contact openings to create recessed conductive layer edges. Dielectric liners are formed within the contact openings covering the insulation layer edges and the recessed conductor layer edges with electrically insulating material deposited within the recessed region, the dielectric liner defining lined contact openings. First, second, third and fourth electrical conductors are created within the lined contact openings using an electrically conductive material, the electrically insulating material within the recessed regions electrically isolating the second, third and fourth electrical conductors from the conductive layers at the first contact level, the first and second contact levels, and the first, second and third contact levels, respectively. Doing so provides enhanced electrical insulation between the electrical conductors and the surrounding conductive layers. The electrical conductors creating step comprises extending the first, second, third and fourth electrical conductors to, and electrically connecting the first, second, third and fourth electrical conductors with, the conductive layers of the first, second, third and fourth contact levels, respectively.

Other aspects and advantages of the present invention can be seen on review of the drawings, the detailed description, and the claims which follow.

BRIEF DESCRIPTION OF THE DRAWINGS

FIG. 2 is a simplified side cross-sectional view of the interconnect region of a three-dimensional stacked IC device illustrating a stack of alternating conductive layers and insulating layers.

FIG. 3 shows the structure of FIG. 2 after the deposition of a spacer layer.

FIG. 4 shows the structure of FIG. 3 with a first photoresist mask having mask openings, and after etching through the first conductive layer at the openings.

FIG. 5 shows the structure of FIG. 4 with a second photoresist mask with mask openings, and after etching through two conductive layers at the openings.

FIG. 6 illustrates the structure of FIG. 5 following the removal of the second photoresist mask.

FIG. 7 shows the results of sidewall etching the exposed conductive layers at the various contact levels creating recesses between the overlying and underlying insulating layers.

FIG. 8 shows result of removing the electrically insulating spacer layer at the bottom of the interlevel plug opening and the first plug opening, and the removal of the conductive layer materials covering the second, third and fourth conductive layers for the second, third and fourth plug openings.

FIG. 9 shows the structure of FIG. 8 after depositing electrically nonconducting spacer layer material filling the recesses and lining the plug openings.

FIG. 10 shows the structure of FIG. 9 after the spacer layer material at the bottom of each plug opening has been removed.

FIG. 11 shows the structure of FIG. 10 after the formation of a third photoresist mask followed by etching.

FIG. 12 shows the structure of FIG. 11 after etching of the exposed insulating layers at the interlevel plug opening creating recesses between overlying and underlying conductive layers, followed by removal of the second photoresist mask.

FIG. 13 shows the structure of FIG. 12 after the plug openings have been filled to create a interlevel plug in electrical contact with each of the conductive layers, and first, second, third and fourth plugs, electrically connected to the first, second, third and fourth conductive layers at the first, second, third and fourth plug openings.

FIG. 14 shows a structure similar to that of FIG. 9 but instead of etching as in FIG. 8, the plug openings are etched partway through the insulating layer covering the second, third and fourth conductive layers followed by depositing electrically nonconducting spacer layer material.

FIG. 15 shows the structure of FIG. 14 after etching partly through the second, third and fourth conductive layers.

FIG. 16 shows the structure of FIG. 15 following deposition of a third photoresist mask in a manner corresponding to that of FIG. 11.

FIG. 17 shows the structure of FIG. 16 after etching of the exposed conductive layers at the interlevel plug opening creating recesses between overlying and underlying conductive layers.

FIG. 18 shows structure similar to that of the structure of FIG. 7 but modified by oxidizing the recessed edges of the first, second and third conductive layers.

FIG. 19 shows the structure of FIG. 18 after etching through the first, second and third insulating layers at the bottom of the second, third and fourth plug openings to expose the second, third and fourth conductive layers.

FIG. 20 shows the structure of FIG. 19 after lining the plug openings with an electrically insulating spacer layer and filling the recesses between the overlying and underlying insulating layers.

DETAILED DESCRIPTION

Figure 1:
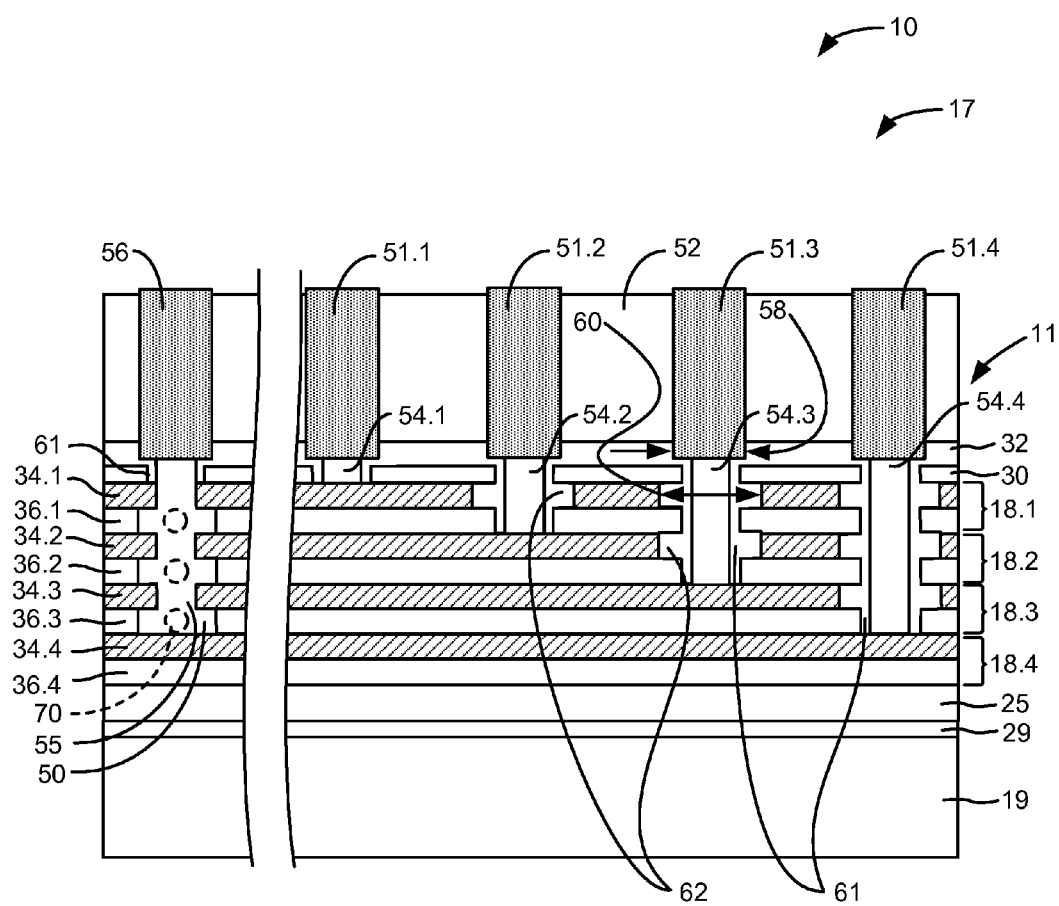
FIG. 1 illustrates a cross-sectional view of an example of a three-dimensional stacked IC device made according to the invention including a stack of contact levels at an interconnect region.

FIG. 1 illustrates a cross-sectional view of a three-dimensional stacked IC device 10 including a stack 11 of at least first, second, third and fourth contact levels 18 at an interconnect region 17. A typical IC device will have many more contact levels than 4 contact levels. Each contact level 18 includes a conductive layer 34 and an insulating layer 36. The first, second, third and fourth contact levels, conductive layers and insulating layers are typically identified in the figures with the corresponding reference numerals 18.1, 34.1, 36.1; 18.2, 34.2, 36.2; etc. Other multiple elements, discussed below, are also often identified in the figures with similar reference numeral designations.

An interlevel plug 55, sometimes referred to as interlevel conductor 55, extends through a portion of stack 11 and is electrically connected to each conductive layer 34. Interlevel plug 55 may or may not be a ground plug. Portions of insulating layers 36 adjacent to interlevel plug 55 are recessed relative to adjacent conductive layers 34 to create annular recessed regions 37, shown in FIG. 12. Generally annular portions 50 of interlevel plug 55 extend into such recessed regions 37 to be between and in electrical contact with overlying and underlying contact levels 18. This provides enhanced electrical contact between interlevel plug 55 and conductive layers 34.

Stack 11 also includes first, second, third and fourth plugs 54.1, 54.2, 54.3 and 54.4, sometimes referred to as electrical conductors or interlevel conductors, in electrical contact with first, second, third and fourth conductive layers 34.1, 34.2, 34.3 and 34.4. Dielectric sidewall spacers 61, also referred to as dielectric liners, electrically isolate the sidewalls of the second, third and fourth plugs 54.2, 54.3 and 54.4 from the first, second and third conductive layers 34.1, 34.2 and 34.3. Portions of conductive layers 34 adjacent to the second, third and fourth plugs 54.2, 54.3 and 54.4 are recessed relative to adjacent insulating layers 36 to create annular recessed regions 39, shown in FIG. 7. Generally annular portions of the dielectric sidewall spacers 61 extend between the adjacent insulating layers 36. This creates a greater distance between such plugs 54 and the surrounding conductive layers 34 thus providing enhanced electrical insulation between the conductive layers and the electrically conductive plugs.

A dielectric layer 25 is below stack 11 and an oxide layer 29 is between dielectric layer 25 and a substrate 19. Dielectric layer 25 is typically SiN, oxide layer 29 is typically $SiO_2$, and substrate 19 is typically a silicon substrate. Above stack 11 is an oxide layer 30, typically $SiO_2$, and a spacer layer 32, typically silicon nitride. Interlayer dielectric 52, typically an oxide such as $SiO_2$ is above spacer layer 32. Plug extension 51.1 through 51.4 passed through interlayer dielectric 52 and spacer layer 32 to contact plugs 54.1 through 54.4, respectively. A interlevel plug extension 56 passes through interlayer dielectric 52 and spacer layer 32 to contact interlevel plug 55.

Figure 8:
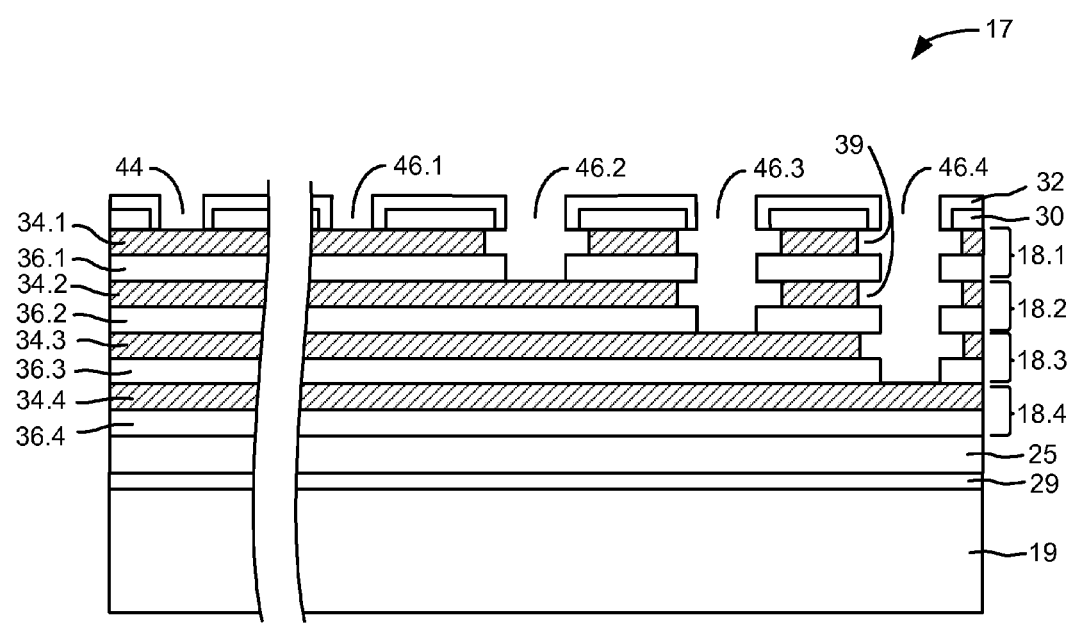
Figure 9:
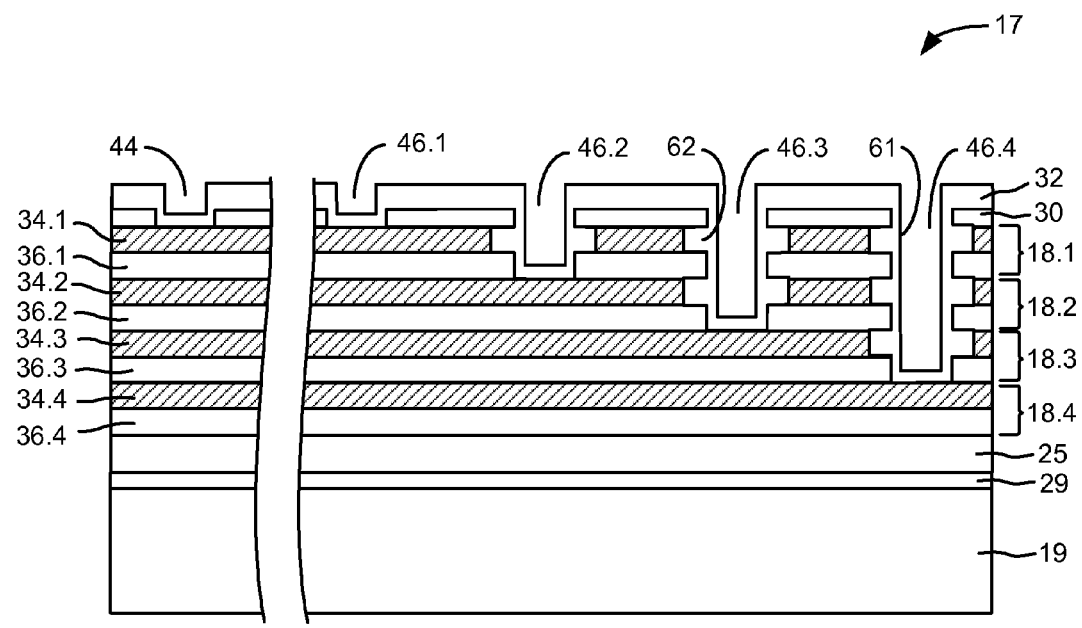

The bottom lateral dimensions 58, commonly referred to as diameters 58, are shorter than the associated lateral dimensions 60, commonly referred to as diameters 60, of spacer layer material 62 deposited within the recessed regions 39; see FIGS. 8 and 9. This relationship is good for the process window because when a contact is misaligned, spacer layer material 62 within recessed region 39 can help stop contact etch.

Figure 2:
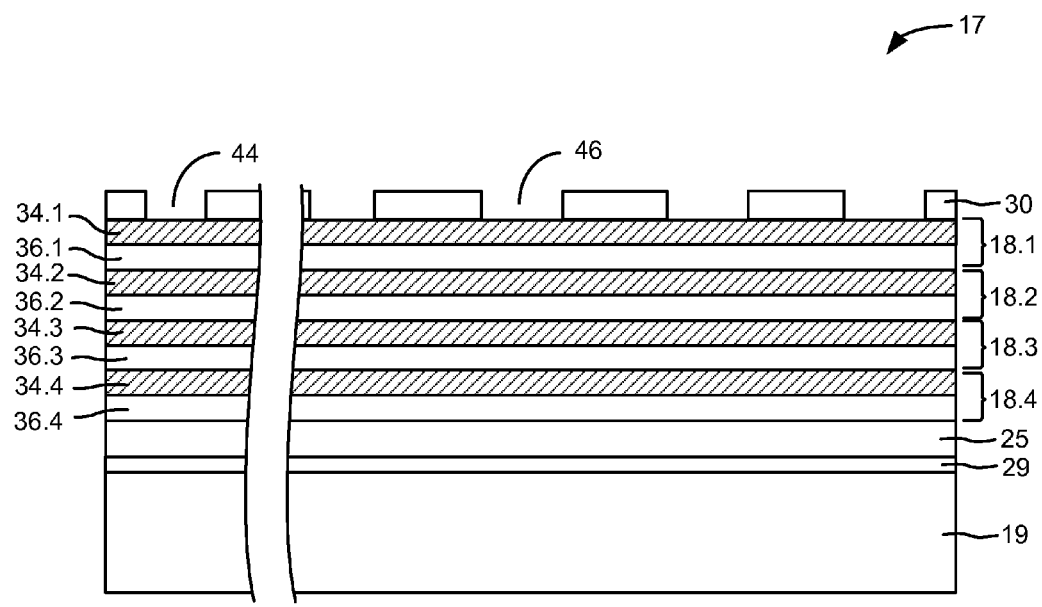
FIGS. 2-13 illustrate the structure and method of making a first example of a three-dimensional stacked IC device.

FIGS. 2-13 illustrate the structure and method of making a first example of a three-dimensional stacked IC device 10. FIG. 2 is a simplified side cross-sectional view of the interconnect region 17 of a three-dimensional stacked IC device 10 illustrating a stack 11 of alternating conductive layers 34 and insulating layers 36. Each conductive layer 34 and insulating layer 36 creates a contact level 18. Oxide layer 30 is on the upper conductive layer 34.1. Oxide layer 30 has a interlevel plug opening 44 and a series of plug openings 46 typically created using a photoresist mask and etching techniques. Plug openings 46 are positioned for accommodating a interlevel plug 55 and series of electrically conductive plugs 54 as discussed below. In practice, interconnect region 17 will typically have more than one interlevel plug 55 and at least one plug 54 for each conductive layer 18.

Figure 3:
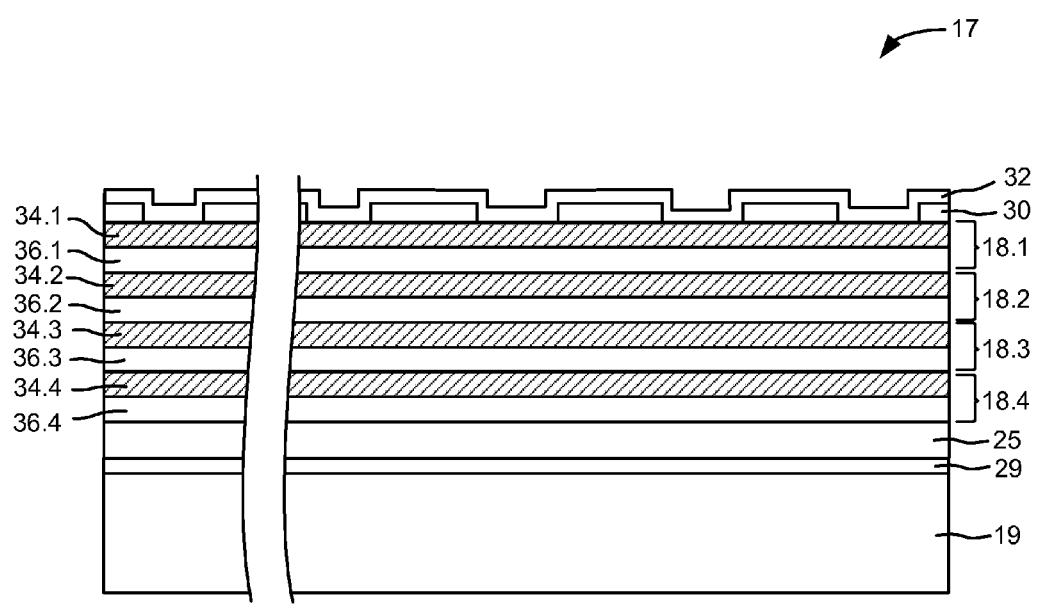
Figure 4:
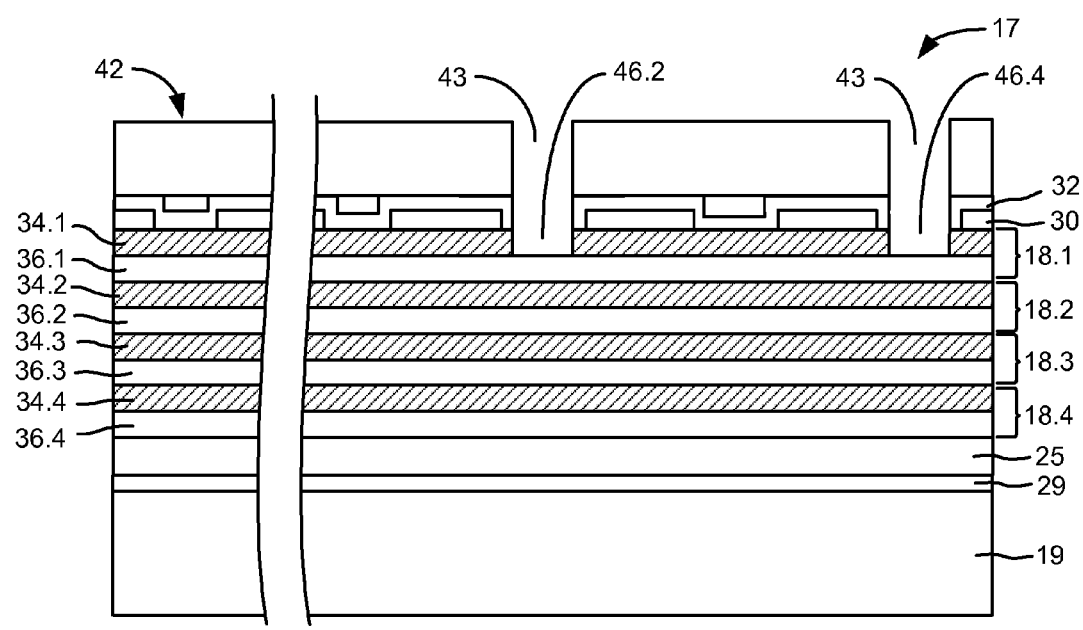

FIG. 3 shows the structure of FIG. 2 after the isotropic deposition of spacer layer 32. Spacer layer 32 is typically silicon nitride. FIG. 4 shows the structure of FIG. 3 after the creation of a first photoresist mask 42 having mask openings 43 at the second and fourth plug openings 46.2 and 46.4. After formation of first photoresist mask 42, the first conductive layer 34.1 is etched through at the second and fourth plug openings 46.2 and 46.4.

Figure 5:
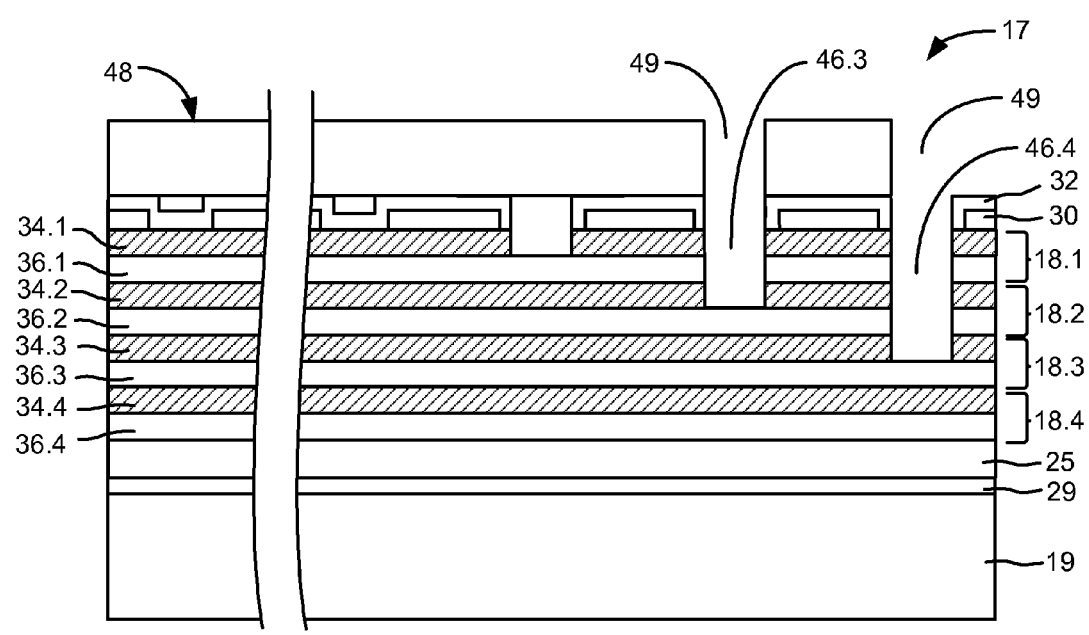
Figure 6:
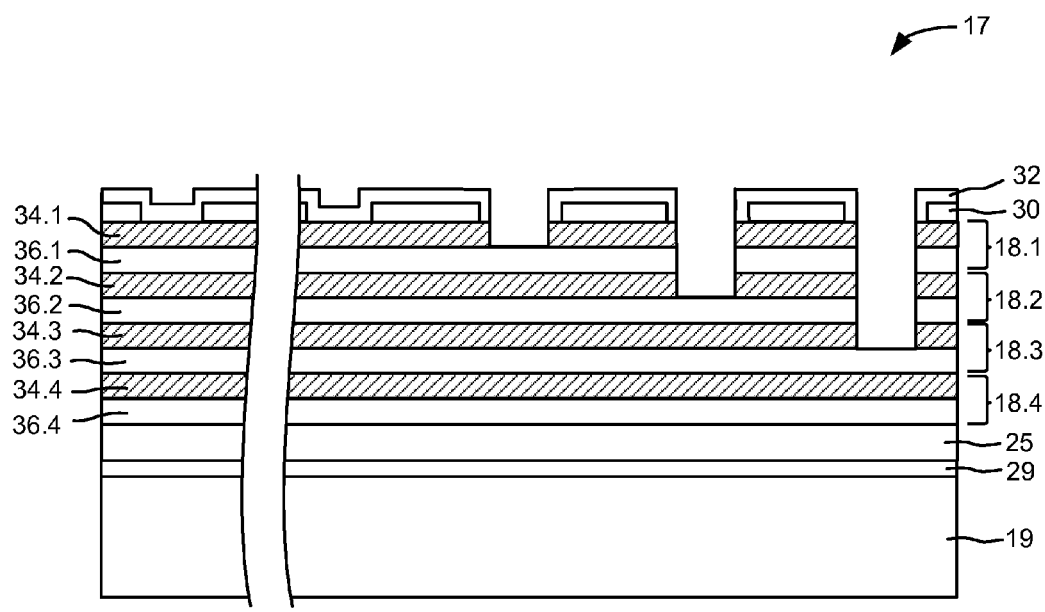

In FIG. 5 the structure of FIG. 4 has been modified by the creation of a second photoresist mask 48 having mask openings 49 at the third and fourth plug openings 46.3 and 46.4. Two conductive layers 34 are etched at each of the third and fourth plug openings 46.3 and 46.4. In particular, first and second conductive layers 34.1 and 34.2 are etched at third plug opening 46.3 and second and third conductive layers are etched at fourth plug opening 46.4. FIG. 6 illustrates the structure of FIG. 5 following the removal of the second photoresist mask 48.

Figure 7:
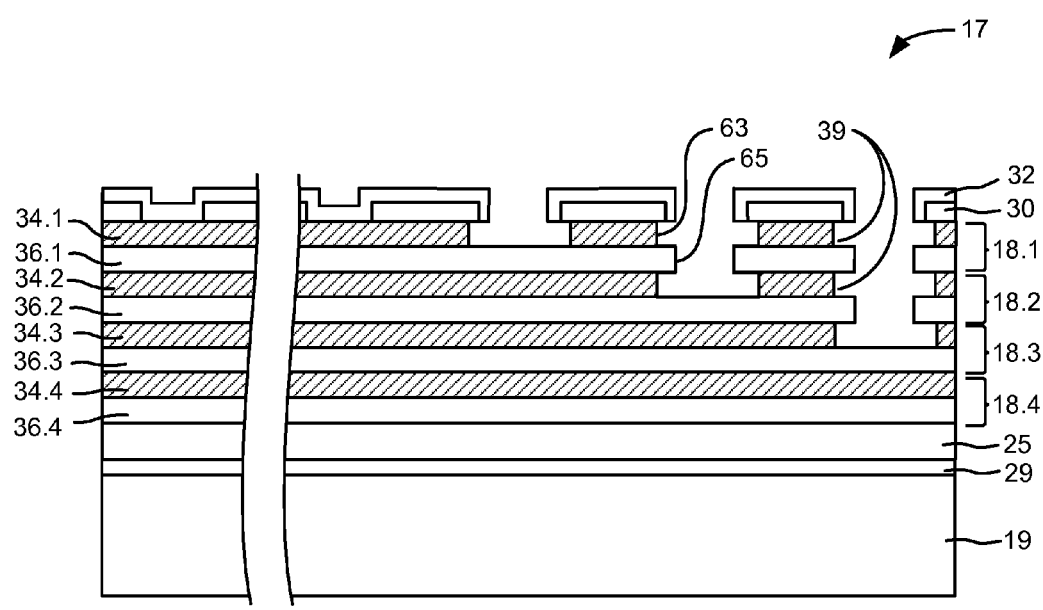

FIG. 7 shows the results of sidewall etching the exposed conductive layers 34 at the various contact levels 18 for the second, third and fourth plug openings 46.2, 46.3 and 46.4. This sidewall etching, sometimes referred to as poly pull back, creates generally annular recessed regions 39, sometimes referred to as recesses, between the overlying and underlying insulating layers 36. As described below, these recessed regions 39 will be filled with electrically insulating material to create thicker insulation between the plug 54 to be created within plug openings 46 and the surrounding conductive layers 34. The amount of the recess, that is the horizontal distance in FIG. 7 from the surface 63 of the etched back conductive layer 34 to the surface 65 of the insulation layer 36 at plug opening 46, is preferably greater than 10 nm for better isolation.

FIG. 8 shows the removal of portions of the first, second and third insulating layers 36.1, 36.2 and 36.3 covering the second, third and fourth conductive layers 38.2, 38.3 and 38.4 at the second, third and fourth plug openings 46.2, 46.3 and 46.4. This is sometimes referred to as oxide breakthrough in that the insulating layers 36 are typically oxide layers.

In FIG. 9 the structure of FIG. 8 is shown after depositing electrically nonconducting spacer layer material 62, typically silicon nitride, which fills the recessed regions 39. Spacer layer material 62 also lines the plug openings 46 to create dielectric sidewall spacers 61.

Figure 10:
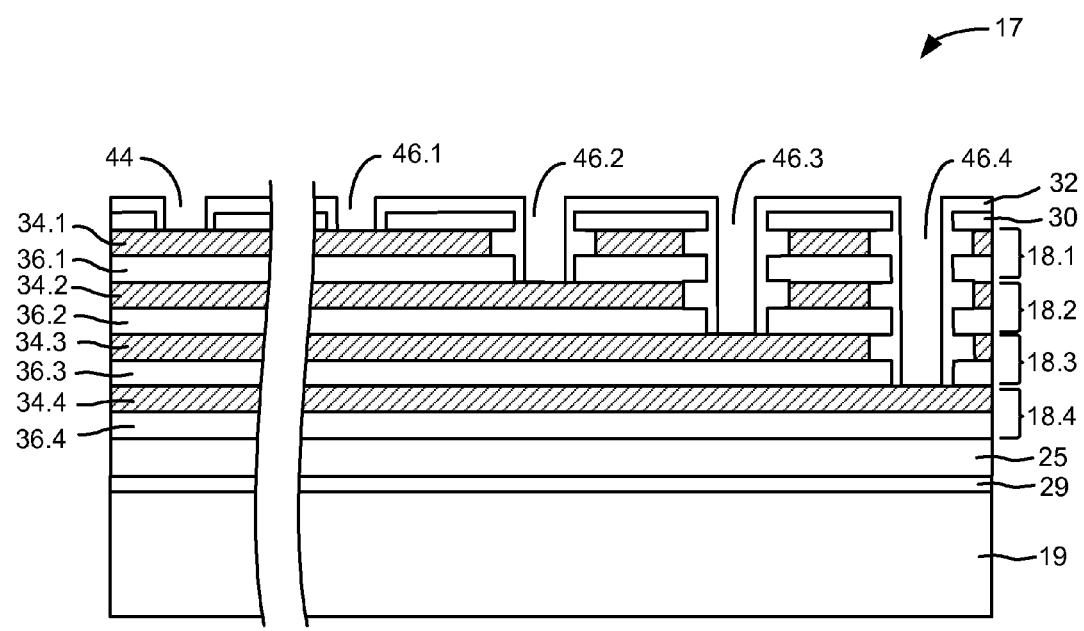

The structure of FIG. 9 is shown in FIG. 10 after the spacer layer material 62 at the bottoms of interlevel plug opening 44 and each plug opening 46 has been removed. This is sometimes referred to as silicon nitride breakthrough because of the composition of spacer layer material 62. This exposes the following conductive layers: first conductive layer 34.1 at the interlevel plug opening 44 and at first plug opening 46.1, second conductive layer 34.2 at second plug opening 46.2, third conductive layer 34.3 at third plug opening 46.3, and fourth conductive layers 34.4 at fourth plug opening 46.4.

Figure 11:
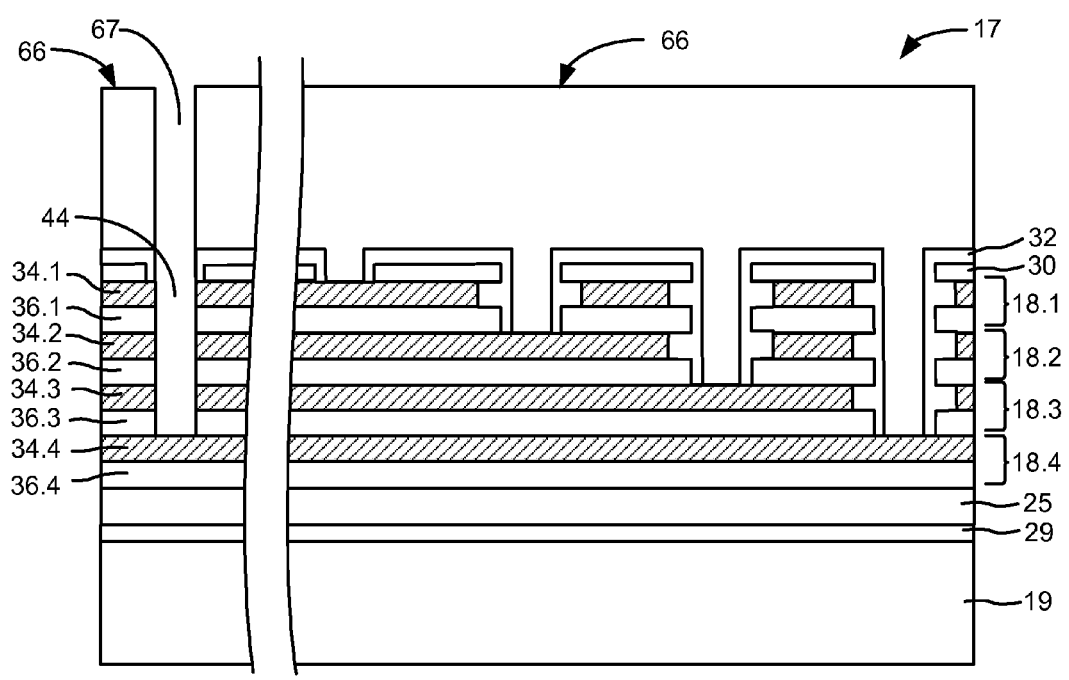

FIG. 11 shows the structure of FIG. 10 after the formation of a third photoresist mask 66 which covers the plug openings 46 while providing a mask opening 67 at the interlevel plug opening 44. The formation of third photoresist mask 66 is followed by etching through contact levels 18.1-18.3 down to the fourth conductive layer 34.4 at interlevel plug opening 44.

Figure 12:
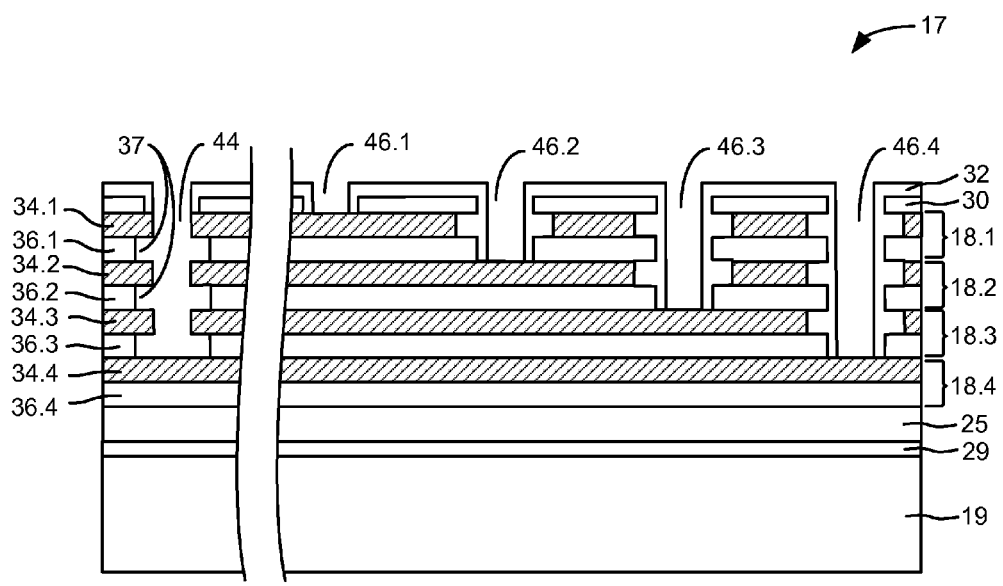

In FIG. 12 the result of an oxide recess etching step is shown, insulating layers 36 being oxide in this example. The structure of FIG. 11 as shown after etching the exposed first, second and third insulating layers 36.1-36.3 at interlevel plug opening 44. This provides interlevel plug opening 44 with generally annular recessed regions 37. Generally annular recessed regions 37 create recesses between overlying and underlying conductive layers 34. This is followed by removal of third photoresist mask 66.

Figure 13:
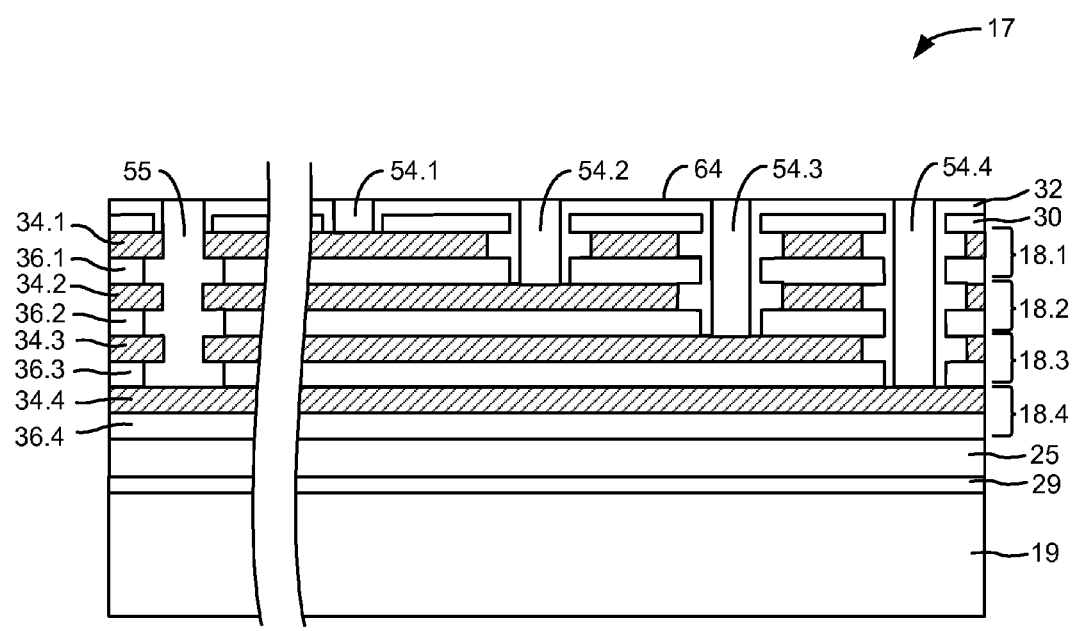

FIG. 13 shows the structure of FIG. 12 after interlevel plug opening 44 has been filled with electrically conductive material, typically polysilicon, to create an interlevel plug 55 in electrical contact with each of the conductive layers 34.1-34.4. The provision of generally annular recessed regions 37 causes interlevel plug 55 to have generally annular portions 50 extending between and in electrical contact with overlying and underlying conductive layers 34. The electrical contact surface between interlevel plug 55 and the conductive layers 34 is much greater than if the interlevel plug were deposited within the generally cylindrical interlevel plug opening 44 shown in FIG. 11. The result is enhanced electrical contact between the interlevel plug 55, with generally annular portion 50, and conductive layers 34.

FIG. 13 also shows the creation of plugs 54.1-54.4 within plug openings 46.1-46.4. First, second, third and fourth plugs 54.1-54.4 are electrically connected to the first, second, third and fourth conductive layers 34.1-34.4. This deposition of the conductive material is followed by chemical mechanical polishing to create the upper surface 64 shown in FIG. 13. This is followed by the deposition of interlayer dielectric 52 and the creation of vias 72 within interlayer dielectric 52 aligned with interlevel plug 55 and plugs 54.1-54.4. Electrically conductive interlevel plug extension 56 and plug extensions 51.1-51.4 are formed in the vias 72 to create the structure of FIG. 1.

Figure 14:
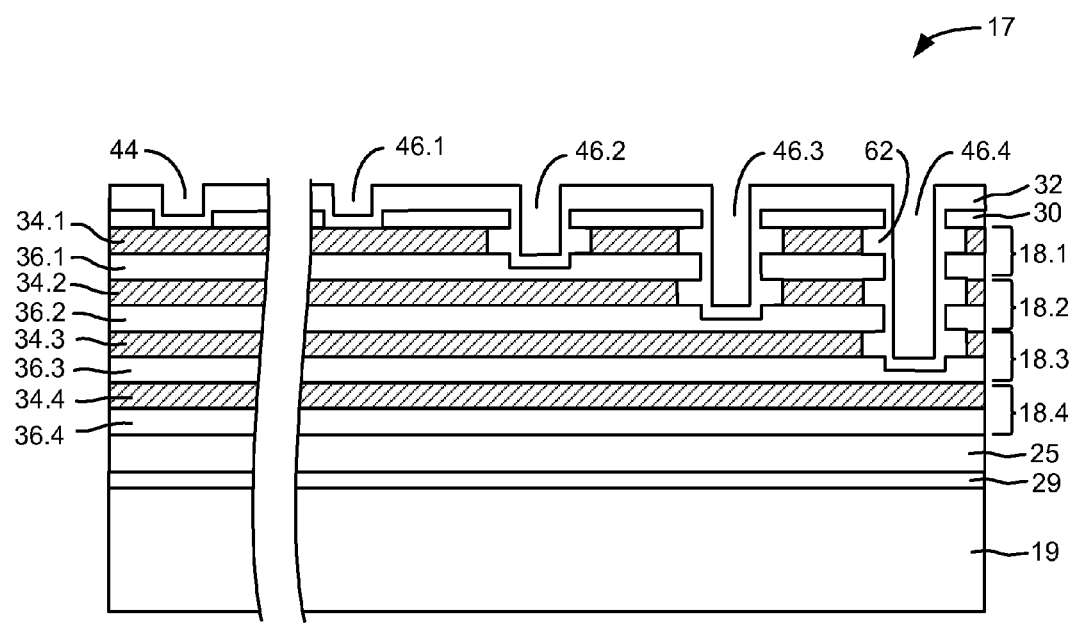
FIGS. 14-17 illustrate the structure and method of making a second example of a three-dimensional stacked IC device.

FIGS. 14-17 illustrate the structure and method of making a second example of a three-dimensional stacked IC device 10. FIG. 14 shows a structure similar to that of FIG. 9 but instead of having previously etched completely through the insulating layers 36.1-36.3 for the second, third and fourth plug openings 46.2-46.4 as in FIG. 8, the plug openings 46.2-46.4 are etched partway through the first, second and third insulating layers 36.1-36.3 covering the second, third and fourth conductive layers 34.2-34.4. This is followed by depositing electrically nonconducting spacer layer material 62, typically silicon nitride, in a manner substantially similar to that discussed with reference to FIG. 9.

Figure 15:
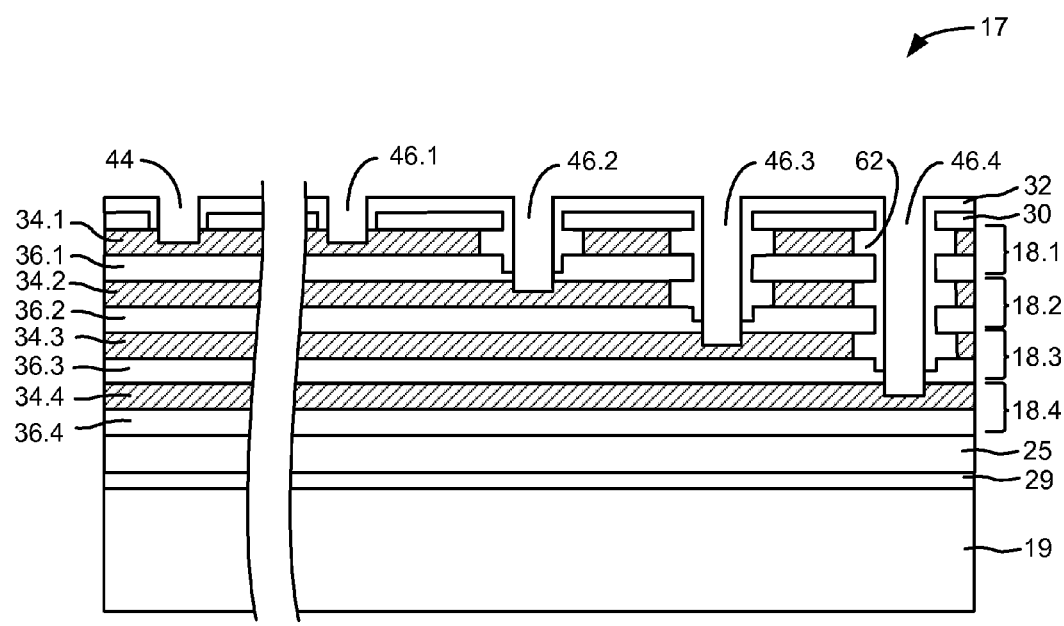

In FIG. 15 the structure of FIG. 14 is shown after etching through the spacer layer material 62 at the bottom of each of the interlevel plug openings 44 and the plug openings 46. FIG. 15 also shows the results of etching part way into the second, third and fourth conductive layers 34.2-34.4. This is sometimes referred to as silicon nitride/oxide breakthrough.

Figure 16:
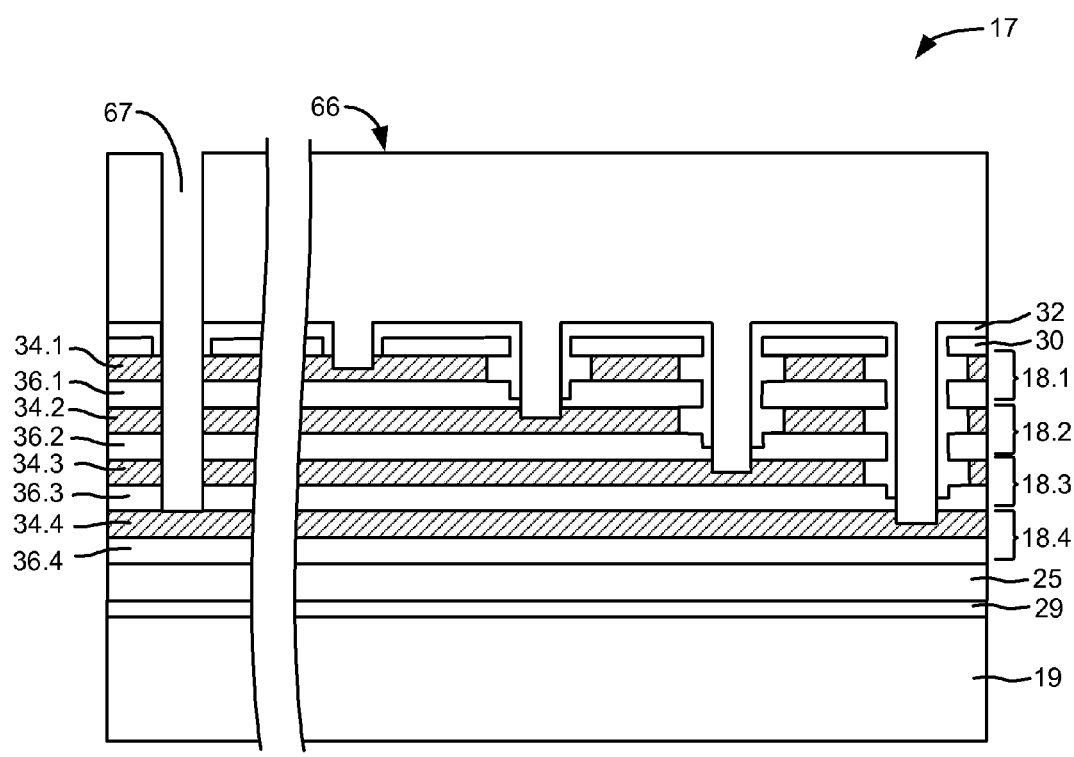
Figure 17:
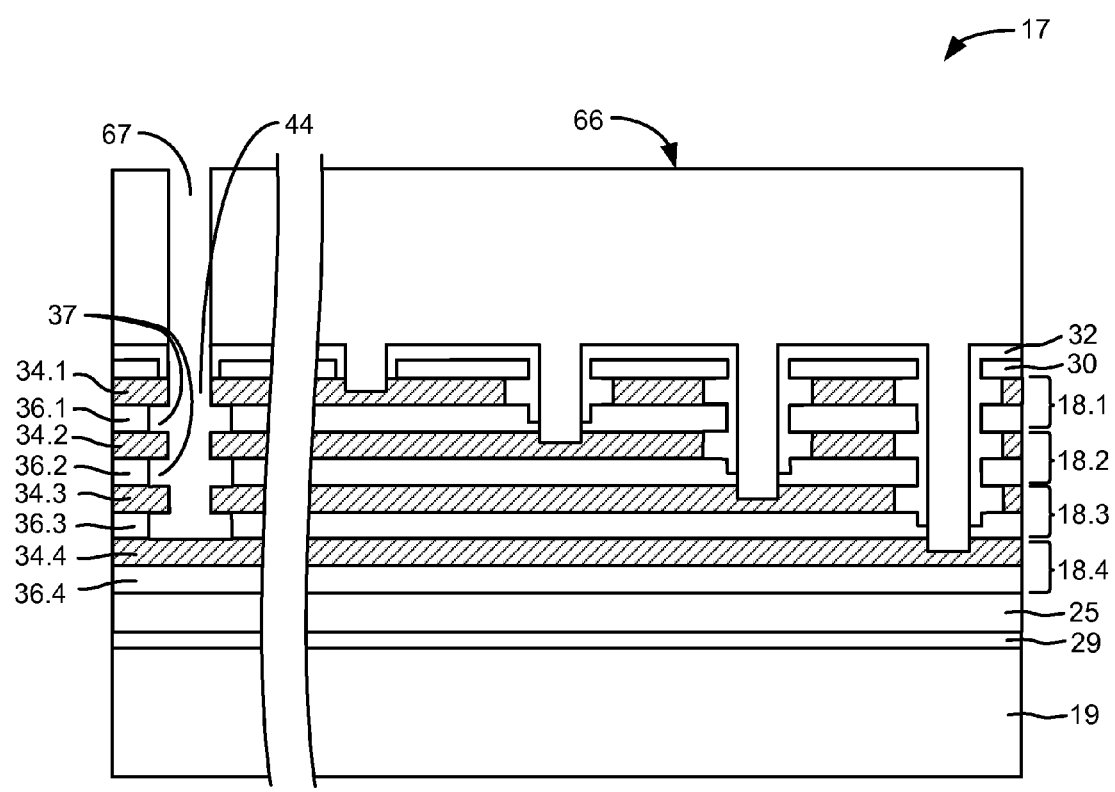

FIG. 16 shows the structure of FIG. 15 following deposition of a third photoresist mask 66 in a manner corresponding to that of FIG. 11. FIG. 17 shows the structure of FIG. 16 after etching of the exposed conductive layers 34.1-34.3 at the interlevel plug opening 44. This creates annular recessed regions 37 between overlying and underlying conductive layers in a manner similar to that of FIG. 12. Both of the examples of FIG. 17 and FIG. 12 need an oxide recess process, also called oxide pull back process, to create regions 37. Normally, it is possible to use BOE/HF (buffered hydrofluoric acid as the oxide etchant) for this purpose. The difference is that in FIG. 17, the non-target area is under the protection of photoresist mask 66 during the oxide pull back process, while in the example of FIG. 12 photoresist mask 66 is not present for protection during the oxide pull back process; rather, protection is provided by SiN spacer layer 32. The difference in the protection in the examples of FIGS. 12 and 17 should not too much because of the protection of the sidewall provided by spacer layer 32. However, there is some oxide exposed under SiN spacer layer 32 in FIG. 16, so there is more protection with the example of FIG. 17 than example of FIG. 12 during the oxide pull back process. The remaining steps for this second example correspond to those discussed with reference to FIGS. 12 and 13.

Figure 18:
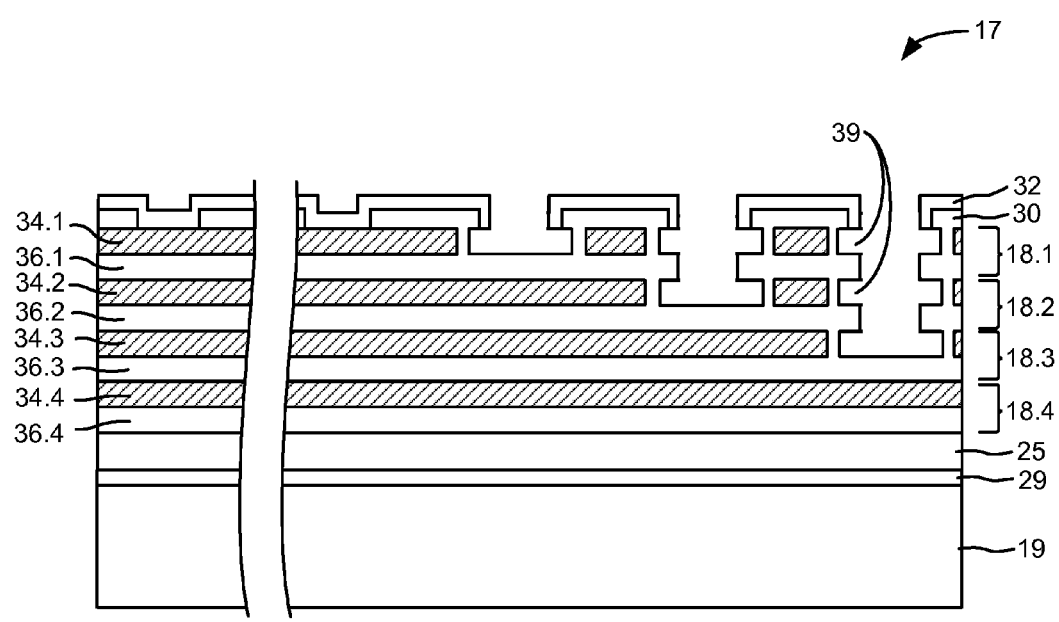
FIGS. 18-20 illustrate the structure and method of making a third example of a three-dimensional stacked IC device.
Figure 19:
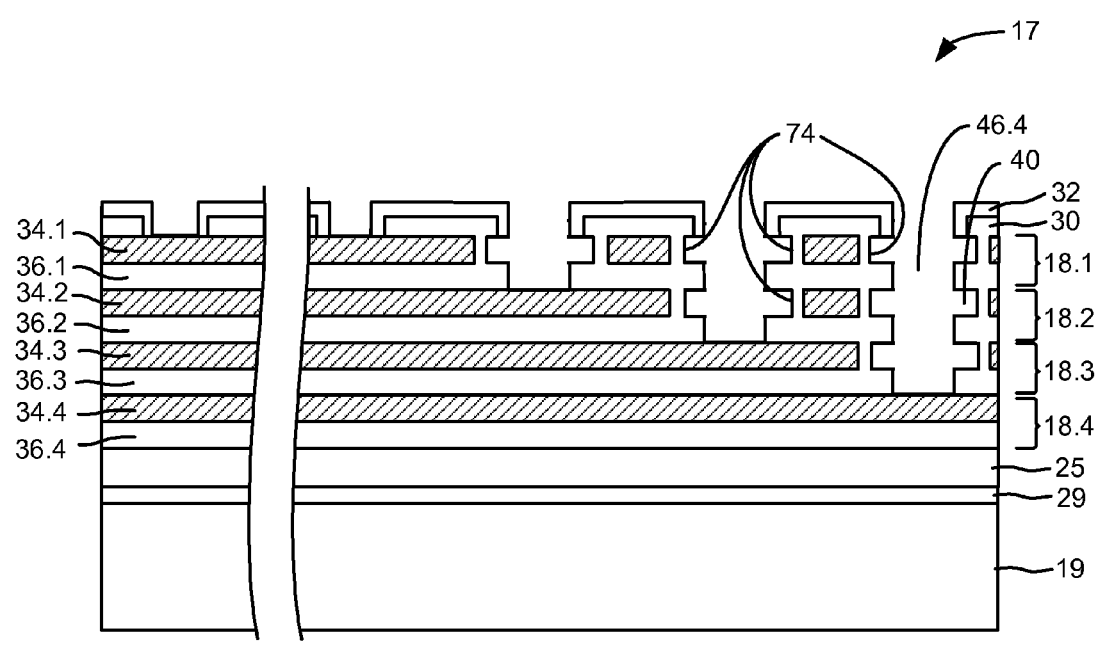
Figure 20:
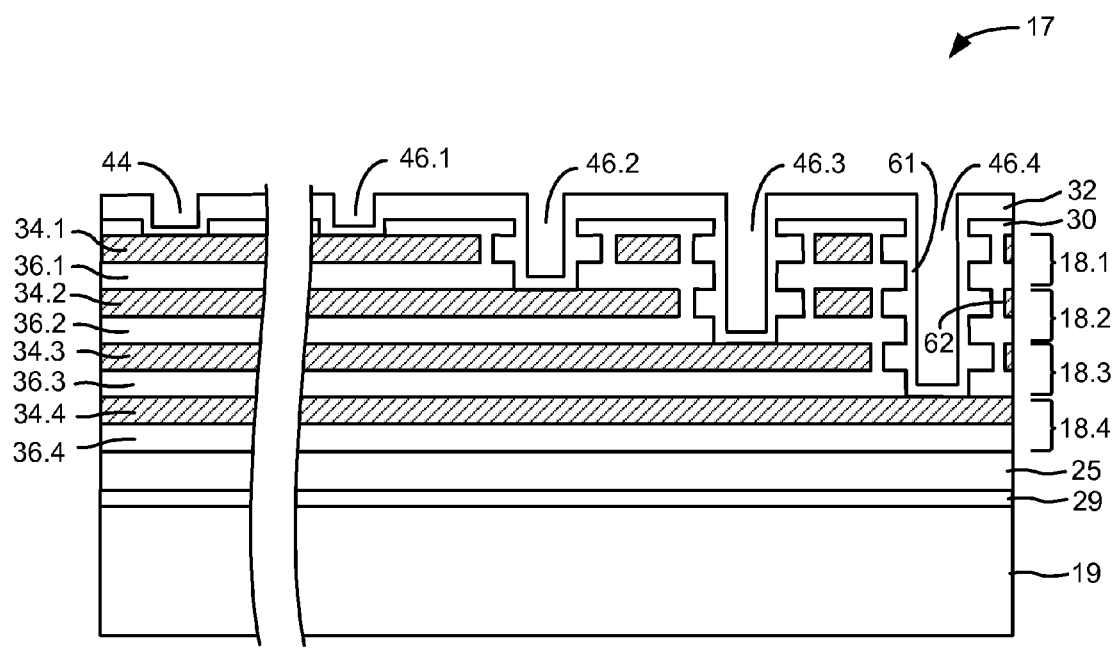

FIGS. 18-20 illustrate the structure and method of making a third example of a three-dimensional stacked IC device 10. FIG. 18 shows structure similar to that of the structure of FIG. 7 but modified by oxidizing the recessed first, second and third polysilicon conductive layers 34.1-34.3 to create oxidize portions 74. This is sometimes referred to as poly oxidation when conductive layers 34 are polysilicon. Doing creates annular recessed regions 39 and also so electrically insulates the second plug opening 46.2 from the first conductive layer 34.1, the third plug opening 46.3 from the first and second conductive layers 34.1 and 34.2, and the fourth plug opening 46.4 from the first, second and third conductive layers 34.1-34.3.

In FIG. 19 the structure of FIG. 18 is shown after etching through the first, second and third insulating layers 36.1-36.3 at the bottoms of the second, third and fourth plug openings 46.2-46.4 to expose the second, third and fourth conductive layers 34.2-34.4. This is sometimes referred to as oxide breakthrough.

The structure of FIG. 19 is shown in FIG. 20 after lining the plug openings 46 with an electrically insulating spacer layer 61, typically silicon nitride, and filling the annular recessed regions 39 of plug openings 46 between the overlying and underlying insulating layers 36. The remaining steps for this example correspond to those of FIGS. 12 and 13.

In some examples, multiple voids 70, shown in dashed lines in FIG. 1, may be created in interlevel plug 55 due to the pullback topology. The existence of voids 70 may be an indication that the interlevel plug was created by etching the insulating layers 36 as taught by the present invention.

Any and all patents, patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An IC device comprising:
   a stack of contact levels, each contact level comprising a conductive layer and an insulation layer;
   first and second interlevel conductors within respective first and second openings in the stack of contact levels, the first opening passing through n contact levels of the stack of contact levels, the second opening passing through n+1 contact levels of the stack of contact levels, n being an integer equal to at least 1;
   the first interlevel conductor being electrically insulated from the conductive layers of the n contact levels, the second interlevel conductor being electrically insulated from the conductive layers of the n+1 contact levels;
   the first interlevel conductor terminating at and in electrical contact with conductive layer n+1, the second interlevel conductor terminating at and in electrical contact with conductive layer n+2; and
   portions of conductive layers at the first and second openings being separated from the interlevel conductors by respective recesses having insulating material therein.

2. The IC device according to claim 1, further comprising:
   an electrically insulating layer over the stack of contact levels; and
   first and second interlevel conductor extensions passing through the electrically insulating layer and making electrical contact with the first and second interlevel conductors.

3. The IC device according to claim 2, further comprising:
   first and second dielectric liners surrounding the first and second interlevel conductors within the first and second openings;
   the first dielectric liner comprising a portion extending between adjacent insulation layers and around the first interlevel conductor;
   the first interlevel conductor extension having a first lateral dimension at the first interlevel conductor; and
   the portion of the first dielectric liner having a second lateral dimension, the second lateral dimension being larger than the first lateral dimension.

4. The IC device according to claim 1, further comprising:
   first and second dielectric liners surrounding the first and second interlevel conductors within the first and second openings; and
   the dielectric liners comprising portions extending between adjacent insulation layers.

5. The IC device according to claim 4, wherein the portions of the dielectric liner are generally annular.

6. The IC device according to claim 1, wherein the recessed portions of the conductive layers are recessed at least 10 nm relative to the adjacent insulation layers.

7. A three-dimensional stacked IC device comprising:
   a stack of at least first, second, third and fourth contact levels;
   each contact level comprising a conductive layer and an insulation layer;
   first, second, third and fourth electrical conductors being within contact openings, the contact openings passing through portions of the stack of contact levels;

the first, second, third and fourth electrical conductors terminating at and in electrical contact with the first, second, third and fourth conductive layers, respectively;

the second electrical conductor is electrically isolated from the first conductive layer, the third electrical conductor is electrically isolated from the first and second conductive layers, and the fourth electrical conductor is electrically isolated from the first, second and third conductive layers; and portions of the conductive layers at the conductive openings being recessed relative to the adjacent insulation layers with electrical insulation between said adjacent insulation layers to provide enhanced electrical insulation between opposed conductive layers and electrical conductors.

8. The stacked IC device according to claim 7, further comprising:

an electrically insulating layer over the stack of contact levels; and first, second, third and fourth electrical conductor extensions passing through the electrically insulating layer and making electrical contact with the first, second, third and fourth electrical conductors.

9. The IC device according to claim 8, wherein:

the electrical conductor extensions have first lateral dimensions at the electrical conductors; and the portions of the dielectric liners extend around the electrical conductors, the electrical insulation between adjacent insulation layers having second lateral dimensions, the second lateral dimensions being larger than the first lateral dimensions for at least some of the electrical conductor extensions.

10. The stacked IC device according to claim 7, wherein the first, second, third and fourth electrical conductors directly physically contact the conductive layers of the first, second, third and fourth contact levels, respectively.

11. The stacked IC device according to claim 7, wherein the electrical insulation between adjacent insulation layers are generally annular.

12. The IC device according to claim 7, wherein the recessed portions of the conductive layers are recessed at least 10 nm relative to the adjacent insulation layers for at least some of the conductive layers.

13. The IC device according to claim 1, further comprising:

a plug opening passing through at least some of the stack of contact levels; and an interlevel plug within the plug opening in electrical contact with the conductive layers of said at least some of the stack of contact levels.

14. The IC device according to claim 7, further comprising:

a plug opening passing through at least the first, second and third contact levels; and an interlevel plug within the plug opening in electrical contact with the first, second, third and fourth conductive layers.

15. An IC device comprising:

a stack of contact levels, each contact level comprising a conductive layer and an insulation layer;

first and second interlevel conductors within respective first and second openings in the stack of contact levels, the first opening passing through n contact levels of the stack of contact levels, the second opening passing through n+1 contact levels of the stack of contact levels, n being an integer equal to at least 1;

the first interlevel conductor terminating at and in electrical contact with conductive layer n+1, the second interlevel conductor terminating at and in electrical contact with conductive layer n+2; and portions of conductive layers at the first and second openings being separated from the interlevel conductors by respective recesses having insulating material therein.

* * * * *